United States Patent
Pyo et al.

(10) Patent No.: US 8,728,704 B2
(45) Date of Patent: May 20, 2014

(54) DONOR SUBSTRATES, LASER INDUCED THERMAL IMAGING METHODS USING DONOR SUBSTRATES AND METHODS OF MANUFACTURING ORGANIC LIGHT EMITTING DISPLAY DEVICES USING DONOR SUBSTRATES

(71) Applicant: Samsung Display Co., Ltd., Yongin (KR)

(72) Inventors: Sang-Woo Pyo, Yongin (KR); Ha-Jin Song, Yongin (KR); Byeong-Wook Yoo, Yongin (KR); Hyo-Yeon Kim, Yongin (KR); Kwan-Hee Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/838,658

(22) Filed: Mar. 15, 2013

(65) Prior Publication Data

US 2013/0341601 A1 Dec. 26, 2013

(30) Foreign Application Priority Data

Jun. 25, 2012 (KR) ........................ 10-2012-0068027

(51) Int. Cl.
*G03C 8/00* (2006.01)

(52) U.S. Cl.
USPC ................ 430/200; 257/40; 438/22; 313/501

(58) Field of Classification Search
USPC ................ 257/40; 438/22; 430/200; 313/501
See application file for complete search history.

(56) References Cited

U.S. PATENT DOCUMENTS

| | | | |
|---|---|---|---|
| 6,667,143 B2 * | 12/2003 | Nirmal et al. ................. | 430/200 |
| 7,361,416 B2 * | 4/2008 | Kim et al. .................... | 428/690 |
| 7,598,115 B2 * | 10/2009 | Song et al. .................... | 438/99 |

FOREIGN PATENT DOCUMENTS

| | | |
|---|---|---|
| KR | 1020050063534 A | 6/2005 |
| KR | 1020070096082 A | 10/2007 |
| KR | 1020110008790 A | 1/2011 |

* cited by examiner

*Primary Examiner* — David Vu
*Assistant Examiner* — Brandon Fox
(74) *Attorney, Agent, or Firm* — Knobbe, Martens, Olson & Bear, LLP

(57) ABSTRACT

A donor substrate includes a base substrate, a light to heat conversion layer, a buffer layer and a transfer layer. The light to heat conversion layer may be disposed on the base substrate. The buffer layer may be disposed on the light to heat conversion layer. The buffer layer may include at least one porous layer having a plurality of pores. The transfer layer may be disposed on the buffer layer.

18 Claims, 7 Drawing Sheets

DONOR SUBSTRATES, LASER INDUCED THERMAL IMAGING METHODS USING DONOR SUBSTRATES AND METHODS OF MANUFACTURING ORGANIC LIGHT EMITTING DISPLAY DEVICES USING DONOR SUBSTRATES

CROSS-REFERENCE TO RELATED APPLICATIONS

This application claims priority under 35 USC §119 to Korean Patent Application No. 10-2012-0068027 filed on Jun. 25, 2012 in the Korean Intellectual Property Office (KIPO), the contents of which are herein incorporated by reference in its entirety.

BACKGROUND

1. Field

Example embodiments relate to donor substrates, laser induced thermal imaging method using donor substrates and methods of manufacturing organic light emitting display devices using donor substrates. More particularly, example embodiments relate to donor substrates including buffer layers, laser induced thermal imaging methods using donor substrates including buffer layers and methods of manufacturing organic light emitting display devices using donor substrates including buffer layers.

2. Description of the Related Art

Generally, organic light emitting display devices may include various organic layers such as an organic light emitting layer, a hole injection layer, an electron transfer layer, etc. In processes for forming the organic layers of conventional organic light emitting display devices, an ink-jet printing process may use limited materials for forming the organic layers except the light emitting layer, and it may be necessary to form an additional structure on a substrate for the ink jet printing process. When using a deposition process for forming organic layers, it may be hard to apply the deposition process to the organic light emitting display device having a relatively large area, because the deposition process may use a micro-dimensioned metal mask.

Recently, a laser induced thermal imaging process has been developed for forming organic layers of the organic light emitting display device. In the conventional laser induced thermal imaging process, a laser beam from a laser irradiation apparatus may be converted to thermal energy, and a transfer layer of a donor substrate may be partially transferred on a display substrate of the organic light emitting display device by the thermal energy, thereby to form an organic layer pattern. As for the conventional laser induced thermal imaging process, however, the thermal energy may damage the transfer layer or the display substrate of the organic light emitting display device.

SUMMARY

Example embodiments provide donor substrates capable of reducing thermal damage.

Example embodiments provide laser induced thermal imaging methods capable of alleviating thermal damage.

Example embodiments provide methods of manufacturing organic light emitting display devices using donor substrates capable of reducing thermal damage.

According to example embodiments, there is provided a donor substrate including a base substrate, a light to heat conversion layer, a buffer layer and a transfer layer. The light to heat conversion layer may be disposed on the base substrate. The buffer layer may be disposed on the light to heat conversion layer. The buffer layer may include at least one porous layer having a plurality of pores. The transfer layer may be disposed on the buffer layer.

In example embodiments, the buffer layer further may include at least one intermediate layer disposed on or under the porous layer.

In example embodiments, the buffer layer may include two porous layers, and the intermediate layer may be disposed between the porous layers.

In example embodiments, the intermediate layer may be disposed between the porous layer and the transfer layer.

In example embodiments, the buffer layer may further include at least one heat dissipation layer disposed on or under the intermediate layer.

In example embodiments, the heat dissipation layer may include aluminum (Al), silver (Ag), chromium (Cr), tin (Sn), nickel (Ni), titanium (Ti), cobalt (Co), zinc (Zn), gold (Au), copper (Cu), tungsten (W), molybdenum (Mo), lead (Pb), etc.

In example embodiments, the porous layer may include polyimide, polyester, polycarbonate, polyacryl, polyepoxy, polyethylene, polystyrene, polyethylene terephthalate, etc.

In example embodiments, the buffer layer may block heat transfer from the light to heat conversion layer into the transfer layer.

According to example embodiments, there is provided a laser induced thermal imaging method. In the method, a donor substrate may be provided to include a base substrate, a light to heat conversion layer, a transfer layer and a buffer layer having at least one porous layer. The donor substrate may be laminated on a substrate. A laser beam may be irradiated onto the donor substrate to form an organic layer pattern on the substrate from the transfer layer. The donor substrate may be removed from the substrate.

In example embodiments, the buffer layer may include at least two porous layers and the intermediate layer disposed between the porous layers.

According to example embodiments, there is provided a method of manufacturing an organic light emitting display device. In the method, a donor substrate may be provided to include a base substrate, a light to heat conversion layer, a transfer layer and a buffer layer having at least one porous layer. The donor substrate may be laminated on a substrate. A laser beam may be irradiated onto the donor substrate to form an organic layer pattern on the substrate from the transfer layer. The donor substrate may be removed from the substrate.

In example embodiments, the buffer layer may include at least two porous layers and the intermediate layer disposed between the porous layers.

In example embodiments, the organic layer pattern may include an organic light emitting layer, a hole injection layer, a hole transfer layer, an electron injection layer or an electron transfer layer.

In example embodiments, the buffer layer may block heat transfer from the light to heat conversion layer into the transfer layer during irradiating the laser beam onto the donor substrate.

According to example embodiments, a buffer layer may include at least one porous layer that may include a plurality of pores. The pores may have a relatively small thermal conductivity, so that the buffer layer may reduce an excess thermal transfer from a light to heat conversion layer to a transfer layer. Therefore, the transfer and/or the substrate (to which the organic layer pattern may be transferred) may not be damaged by the thermal energy. Further, the buffer layer may include the intermediate layer that may prevent the transfer layer from being deteriorated by the harmful gas or the impurities.

BRIEF DESCRIPTION OF THE DRAWINGS

Example embodiments will be more clearly understood from the following detailed description taken in conjunction with the accompanying drawings.

FIG. 1 is a cross sectional view illustrating a donor substrate in accordance with example embodiments;

FIG. 2 is a cross sectional view illustrating a donor substrate in accordance with some example embodiments;

FIG. 3 is a cross sectional view illustrating a donor substrate in accordance with some example embodiments;

FIG. 4 is a cross sectional view illustrating a donor substrate in accordance with some example embodiments;

FIGS. 5 to 7 are cross sectional views illustrating a laser induced thermal imaging method in accordance with example embodiments; and FIGS. 8 to 11 are cross sectional views illustrating a method of manufacturing an organic light emitting display device in accordance with example embodiments.

DETAILED DESCRIPTION OF THE PREFERRED EMBODIMENT

Figure 1:
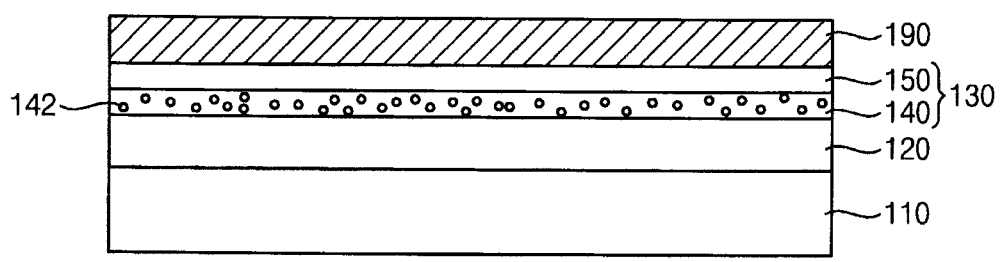
FIGS. 1 to 11 represent non-limiting, example embodiments as described herein.

Various embodiments will be described more fully hereinafter with reference to the accompanying drawings, in which some embodiments are shown. The present embodiments may, however, be embodied in many different forms and should not be construed as limited to the embodiments set forth herein. Rather, these embodiments are provided so that this description will be thorough and complete, and will fully convey the scope of the present embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the present embodiments. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the present embodiments.

Unless otherwise defined, all terms (including technical and scientific terms) used herein have the same meaning as commonly understood by one of ordinary skill in the art to which the present embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating a donor substrate in accordance with example embodiments.

Referring to FIG. 1, a donor substrate 100 may include a base substrate 110, a light to heat conversion layer 120, a buffer layer 130, a transfer layer 190, etc.

The base substrate 110 may include a material that may have a predetermined mechanical strength and a predetermined flexibility. For example, the base substrate 110 may include a transparent polymer such as polyethylene terephthalate, polyester, polyacryl, polyepoxy, polyethylene, polystyrene, etc. When the base substrate 110 has a relatively small thickness, handling of the donor substrate 100 may be difficult. In case that the base substrate 110 has a relatively large thickness, transferring of the donor substrate 100 may also be difficult due to a relatively large weight of the donor substrate 100. Therefore, the base substrate 110 may have a thickness of about 10 μm to about 500 μm. The base substrate 110 may support elements of the donor substrate 100.

The light to heat conversion layer 120 may be disposed on the base substrate 110. The light to heat conversion layer 120 may include a light absorbing material that may convert a laser beam irradiated from a laser irradiation apparatus to thermal energy. In example embodiments, the light to heat conversion layer 120 may include a metal containing layer including aluminum (Al), molybdenum (Mo), oxide thereof and/or sulfide thereof. In this case, the metal containing layer may have a relatively small thickness of about 10 nm to about 500 nm. In some example embodiments, the light to heat conversion layer 120 may include an organic layer including polymers having carbon black, graphite and/or infra-red dye. In this case, the organic layer may have a relatively large thickness of about 100 mm to about 10 μm. An adhesive strength between the transfer layer 190 and the light to heat conversion layer 120 may be changed by the thermal energy caused from the laser beam irradiated onto the light to heat conversion layer 120, so that the transfer layer 190 may be transferred to provide a predetermined pattern on a substrate (not illustrated).

In example embodiments, the light to heat conversion layer 120 may further include a gas generating material such as pentaerythrite tetranitrate (PETN) and/or trinitrotoluene (TNT). When the light to heat conversion layer 120 absorbs the thermal energy, the gas generating material may emit a nitrogen gas or a hydrogen gas to provide an energy for a transfer step of the laser induced thermal imaging process (see FIG. 6).

The buffer layer 130 may be disposed between the light to heat conversion layer 120 and the transfer layer 190. In example embodiments, the buffer layer 130 may include a porous layer 140 and an intermediate layer 150. For example, the buffer layer 130 may have a thickness of about 5 μm to about 300 m. In one example embodiment, the buffer layer 130 may a thickness of about 10 μm to about 100 μm.

The porous layer 140 may be disposed on the light to heat conversion layer 120. In example embodiments, the porous layer 140 may include a plurality of pores 142 irregularly dispersed in a polymer layer. For example, the polymer layer may include polyimide, polyester, polycarbonate, polyacryl, polyepoxy, polyethylene, polystyrene or polyethylene terephthalate. In one example embodiment, the porous layer 140 may include a plurality of pores 142 dispersed in a polyimide layer.

The pores 142 may have a relatively small thermal conductivity, so that the buffer layer 130 may reduce an excess transfer of thermal energy from the light to heat conversion layer 120 into the transfer layer 190. Therefore, the transfer layer 190 may not be damaged by the thermal energy. The porous layer 140 may include the plurality of pores 142, and thus the donor substrate 100 may ensure an improved flexibility. Therefore, the donor substrate 100 may be easily bent according to a profile of a substrate (onto which an organic layer pattern may be transferred) in the laser induced thermal imaging process. However, a roughness of the buffer layer 130 may increase because of the pores 142 in the pours layer 140.

The intermediate layer 150 may be disposed on the porous layer 140. The intermediate layer 150 may not include a pore, and may include a polymer layer having a relatively small thermal conductivity. For example, the polymer layer for the intermediate layer 150 may include polyimide, polyester, polycarbonate, polyacryl, polyepoxy, polyethylene, polystyrene, polyethylene terephthalate, etc. In one example embodiment, the polymer layer may include polyimide.

The intermediate layer 150 may prevent or reduce gases and other impurities from diffusing into the transfer layer 190 in case that the gases may be generated in the light to heat conversion layer 120 or may be out-gassed from the porous layer 140. Therefore, chemical and physical characteristics of the transfer layer 190 may not be deteriorated. Further, the intermediate layer 150 may reduce the roughness of the buffer layer 130 to improve uniformities of the buffer layer 130 and the donor substrate 100.

Although the intermediate layer 150 may be located between the porous layer 140 and the transfer layer 190 in FIG. 1, the present embodiments may not be limited to such a configuration. For example, the intermediate layer 150 may be disposed between the porous layer 140 and the light to heat conversion layer 120, or the intermediate layer 150 may be omitted.

The transfer layer 190 may be disposed on the buffer layer 130. In case of manufacturing an organic light emitting display device using the donor substrate 100, the transfer layer 190 may include a material substantially the same as or substantially similar to that of an organic layer pattern. For example, the organic layer pattern may be formed on a substrate from the transfer layer 190 of the donor substrate 100. In example embodiments, the organic layer pattern may include an organic light emitting layer, a hole injection layer, a hole transfer layer, an electron injection layer, an electron transfer layer, etc. The organic light emitting display device may include a plurality of organic layer patterns obtained from the transfer layer 190.

According to example embodiments, the buffer layer 130 may include the porous layer 140 that may include the plurality of pores 142. The pores 142 may ensure the relatively small thermal conductivity of the buffer layer 130, so that the buffer layer 130 may reduce an excess transfer of thermal energy from the light to heat conversion layer 120 into the transfer layer 190. Therefore, the transfer 190 and/or the substrate (onto which the organic layer pattern may be transferred) may not be damaged by the thermal energy. Further, the buffer layer 130 may include the intermediate layer 150 that may prevent the transfer layer 190 from being deteriorated by the harmful gas or the impurities.

Figure 2:
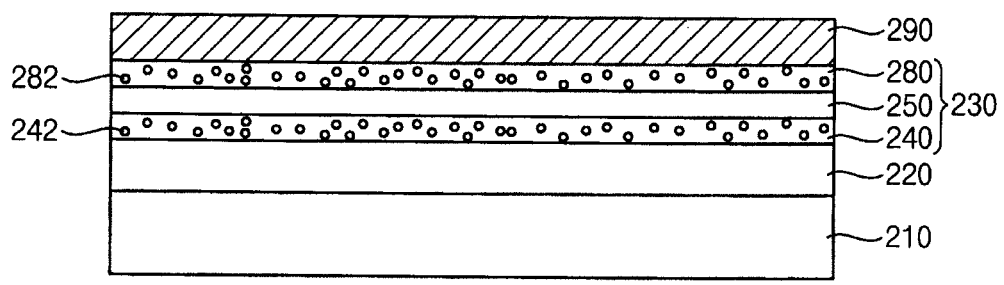

FIG. 2 is a cross sectional view illustrating a donor substrate in accordance with some example embodiments. In FIG. 2, a donor substrate 200 may have a construction substantially the same as or substantially similar to that of the donor substrate 100 described with reference to FIG. 1, except for a buffer layer 230.

The donor substrate 200 may include a base substrate 210, a light to heat conversion layer 220, the buffer layer 230 and a transfer layer 290.

The buffer layer 230 disposed on the light to heat conversion layer 220 may include a first porous layer 240, an intermediate layer 250 and a second porous layer 280.

The first porous layer 240 may have a plurality of first pores 242 irregularly dispersed in a polymer layer, and the second porous layer 280 disposed above the first porous layer 240 may also have second pores 282 irregularly dispersed in another polymer layer. Each of the first porous layer 240 and the second porous layer 280 may include a material substantially the same as or substantially similar to that in the porous layer 140 described with reference to FIG. 1. In example embodiments, each of the first porous layer 240 and the second porous layer 280 may have a thickness substantially smaller than that of the porous layer 140.

The intermediate layer 250 may be disposed between the first porous layer 240 and the second porous layer 280. The intermediate layer 250 may not include any pore, and may have a construction substantially the same as or substantially similar to that of the intermediate layer 150 described with reference to FIG. 1. The intermediate layer 250 between the first porous layer 240 and the second porous layer 280 may prevent a roughness of the buffer layer 230 from being increased by the first pores 242 and the second pores 282. Therefore, uniformities of the buffer layer 230 and the donor substrate 200 may be improved.

According to example embodiments, the buffer layer 230 may include a plurality of porous layers 240 and 280 and the intermediate layer 250 disposed between the porous layers 240 and 280, so that the buffer layer 230 may reduce an excess transfer of thermal energy from the light to heat conversion layer 220 into the transfer layer 290. Further, the intermediate layer 250 may enhance the uniformity of the buffer layer 230.

Figure 3:
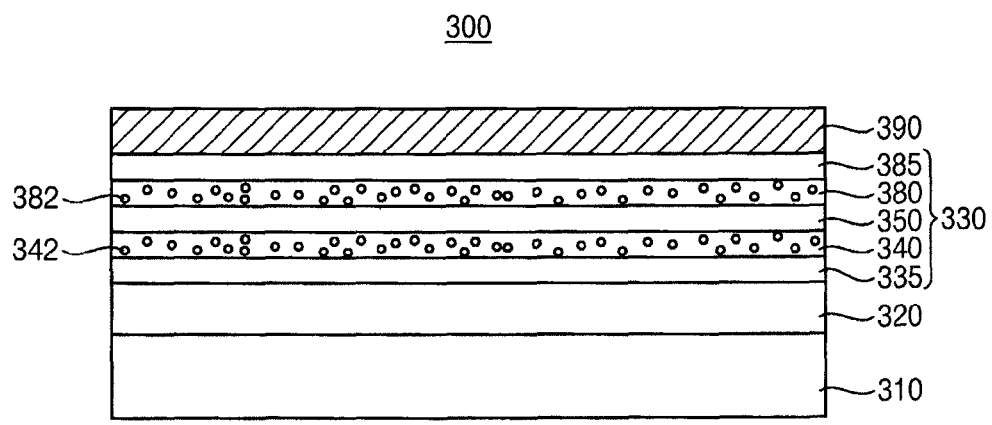

FIG. 3 is a cross sectional view illustrating a donor substrate in accordance with some example embodiments. In FIG. 3, a donor substrate 300 may have a construction substantially the same as or substantially similar to that of the donor substrate 200 described with reference to FIG. 2, except for a buffer layer 330.

The donor substrate 300 may include a base substrate 310, a light to heat conversion layer 320, the buffer layer 330 and a transfer layer 390, and the buffer layer 330 may include a first intermediate layer 335, a first porous layer 340, a second intermediate layer 350, a second porous layer 380 and a third intermediate layer 385

Each of the first to the third intermediate layers 335, 350 and 385 may include a material substantially the same as substantially similar to that of the intermediate layer 150 described with reference to FIG. 1.

The first intermediate layer 335 may be disposed on the light to heat conversion layer 320. The first intermediate layer 335 may reduce a roughness of the buffer layer 330, and may prevent or reduce a gas generated in the light to heat conversion layer 120 from being diffused into the transfer layer 390.

The second intermediate layer 350 may be disposed between the first porous layer 340 and the second porous layer 380. The second intermediate layer 350 may reduce a roughness of the buffer layer 330. Therefore, uniformities of the buffer layer 330 and the donor substrate 300 may be enhanced.

The third intermediate layer 385 may be disposed between the second porous layer 380 and the transfer layer 390. The third intermediate layer 385 may prevent or reduce an outgassed gas, which may be generated form the first and the second porous layers 340 and 380, from diffusing into the transfer layer 390.

According to example embodiments, the buffer layer 330 may include the plurality of porous layers 340 and 380 and the first to the third intermediate layers 335, 350 and 385 disposed adjacent thereto, so that the buffer layer 330 may reduce an excess transfer of heat from the light to heat conversion layer 320 into the transfer layer 390. Further, the first to the third intermediate layers 335, 350 and 385 may improve the uniformity of the buffer layer 330.

Figure 4:
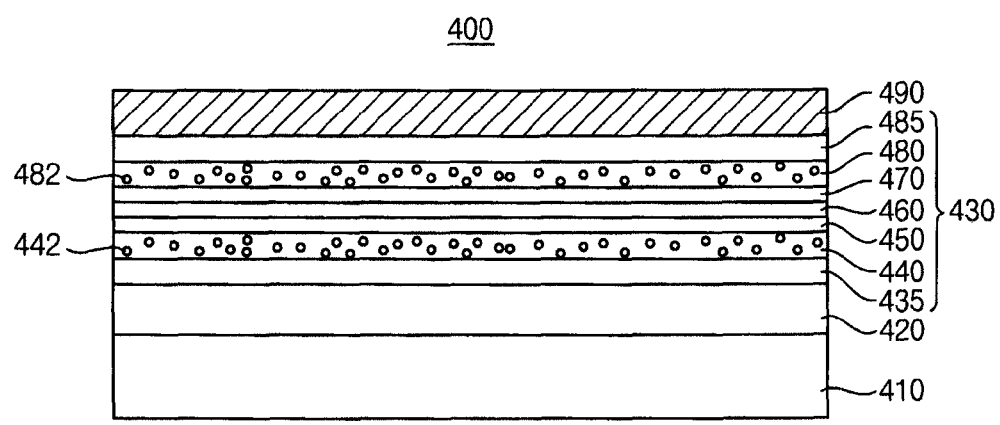

FIG. 4 is a cross sectional view illustrating a donor substrate in accordance with some example embodiments. In FIG. 4, a donor substrate 400 may have a construction substantially the same as or substantially similar to that of the donor substrate 300 described with reference to FIG. 3, except for a buffer layer 430.

The buffer layer 430 may include a first intermediate layer 435, a first porous layer 440, a second intermediate layer 450, a heat dissipation layer 460, a third intermediate layer 470, a second porous layer 480 and a fourth intermediate layer 485.

Each of the first to the fourth intermediate layers 435, 450, 470 and 485 may include a material substantially the same as or substantially similar to that of the intermediate layer 150 described with reference to FIG. 1. Additionally, each of the first porous layer 440 and the second porous layer 480 may have a construction substantially the same as or substantially similar to that of the first and second porous layers 240 and 280 described with reference to FIG. 2.

The heat dissipation layer 460 may be disposed between the second intermediate layer 450 and the third intermediate layer 470. The heat dissipation layer 460 may include a material having a relatively large thermal conductivity. For example, the heat dissipation layer 460 may include aluminum (Al), silver (Ag), chromium (Cr), tin (Sn), nickel (Ni), titanium (Ti), cobalt (Co), zinc (Zn), gold (Au), copper (Cu), tungsten (W), molybdenum (Mo), lead (Pb), etc. These may be used alone or in a combination thereof. When the heat dissipation layer 460 includes the material having the relatively large thermal conductivity, thermal energy may easily diffuse into a lateral direction (for example, a direction substantially parallel to the donor substrate 400). Therefore, a patterning quality of the laser induced thermal imaging process may be improved. When the heat dissipation layer 460 includes a metal, a laser beam may be reflected on the heat dissipation layer 460 into the light to heat conversion layer 420, so that the light to heat conversion layer 420 may be easily heated.

The donor substrate 400 may be depicted to include the second intermediate layer 450, the third intermediate layer 470 and the separated heat dissipation layer 460 in FIG. 4, however the present embodiments may not be limited to such construction. For example, each of the second intermediate layer 450 and the third intermediate layer 470 may include polymer and a mixture of metal, or may include metal particles embedded in a polymer layer.

According to example embodiments, the buffer layer 430 may include the plurality of porous layers 440 and 480 and the plurality of intermediate layers 435, 450, 470 and 485, so that the buffer layer 430 may reduce an excess transfer of thermal energy from the light to heat conversion layer 420 into the transfer layer 490. Further, the first to the third intermediate layers 335, 350 and 385 may improve the uniformity of the buffer layer 330, and may protect the transfer layer 490 from a harmful gas. The donor substrate 400 may further include the heat dissipation layer 460 to improve the quality of the patterning.

Figure 5:
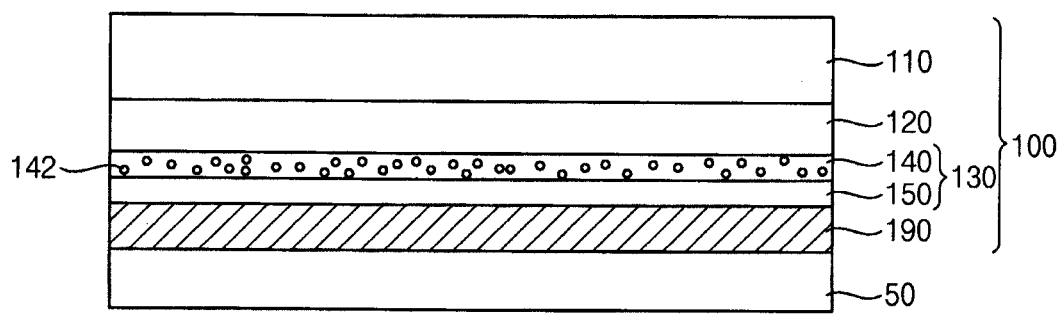
Figure 6:
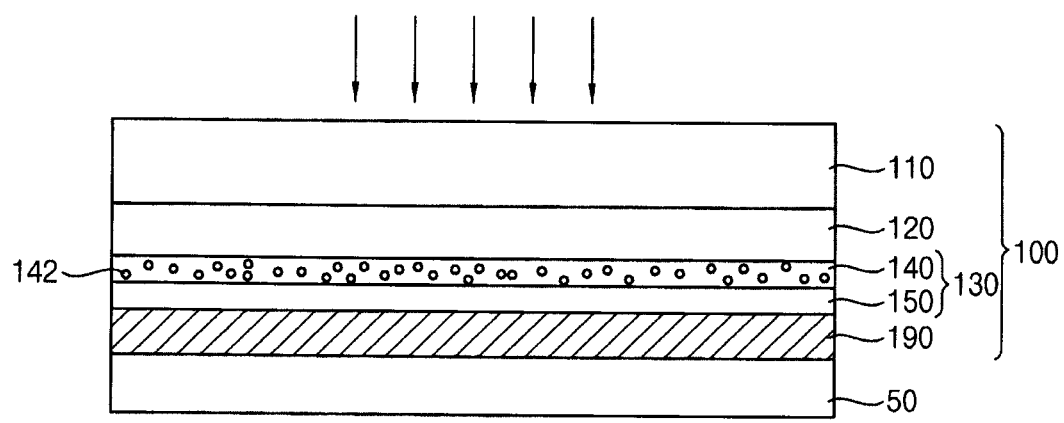
Figure 7:
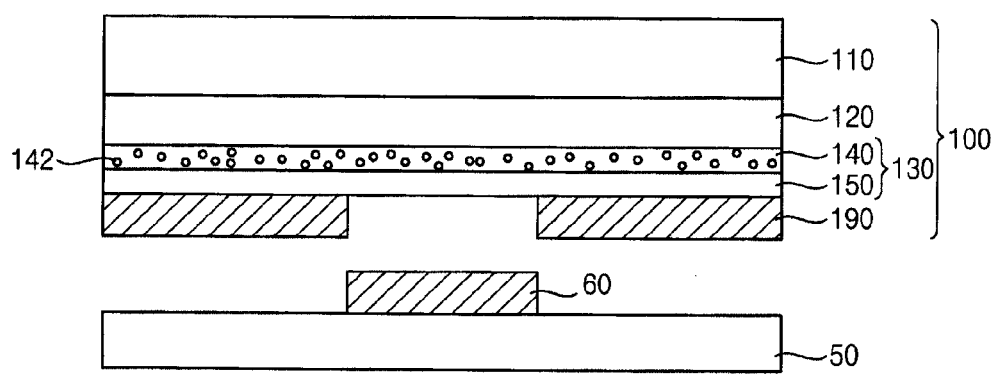

FIGS. 5 to 7 are cross sectional views illustrating a laser induced thermal imaging method in accordance with example embodiments.

Referring to FIG. 5, a donor substrate 100 may be laminated on a substrate 50. The substrate 50 may include any substrates to which an organic layer pattern may be formed by the laser induced thermal imaging process. For example, the substrate 50 may include a substrate of a semiconductor device, a substrate of a display device, a substrate of a touch panel, etc., which may include a switching element (not illustrated) or a semiconductor element (not illustrated). In example embodiments, the substrate 50 may have a substantially flat upper face. Alternatively, the substrate 50 may have a predetermined profile on the upper face.

The donor substrate 100 may have a construction substantially the same as or substantially similar to that of the donor substrate 100 described with reference to FIG. 1. Thus, a detailed description thereof may be omitted. The donor substrate 100 may include a base substrate 110, a light to heat conversion layer 120, a porous layer 140, an intermediate layer 150 and a transfer layer 190.

In example embodiments, after mounting the substrate 50 on a supporting apparatus (not illustrated), the substrate 50 may be aligned with the donor substrate 100. Then, a pressurizing member (not illustrated) may pressurize the donor substrate 100 to laminate the donor substrate 100 on the substrate 50. In example embodiments, the pressurizing member may include a roller, a crown press, etc. In some example embodiments, the donor substrate 100 may be pressurized using gases without using the pressurizing member, so that the donor substrate 100 may be adhered to the substrate 50. According to the above-described lamination process, the donor substrate 100 may be adhered to the substrate 50, and a bubble between the donor substrate 100 and the substrate 50 may be removed.

Referring to FIG. 6, a laser beam may be irradiated on the donor substrate 100. In example embodiments, the laser beam indicated using arrows may be irradiated on a portion of the donor substrate 100 that may be adhered to the substrate 50. The laser beam may be emitted from a flash ramp or a xenon ramp. In the region where the laser beam is irradiated, an adhesive strength between the transfer layer 190 and the substrate 50 may be substantially larger than that between the buffer layer 130 and the transfer layer 190. Therefore, a portion of the transfer layer 190 where the laser beam is irradiated may be removed from the buffer layer 130, and an organic layer pattern 60 (see FIG. 9) may be formed on the substrate 50 from the transfer layer 190.

The light to heat conversion layer 120 may absorb the laser beam, and then may convert the adsorbed layer beam into thermal energy. The thermal energy may be transferred into the transfer layer 190 and the substrate 50. However, the porous layer 140 disposed between the light to heat conversion layer 120 and the transfer layer 190 may include a plurality of pores 142 having a relatively small thermal conductivity, so that the thermal energy may not damage the transfer layer 190 or the substrate 50. Further, the donor substrate 100 may include an intermediate layer 150 between the porous layer 140 and the transfer layer 190, so that a gas generated from the porous layer 140 and the light to heat conversion layer 120 may not diffuse into the transfer layer 190. The intermediate layer 150 may improve a uniformity of the donor substrate 100.

In example embodiments, the organic layer pattern 60 may be formed on the substrate 50 using the laser induced thermal imaging process, so that the organic layer pattern 60 having a relatively high resolution may be obtained with a relatively low cost due to a relatively high resolution of the laser beam.

Referring to FIG. 7, the donor substrate 100 may be removed from the substrate 50.

As described above, the organic layer pattern 60 may be formed on the substrate 50 from the transfer layer 190 of the donor substrate 100, and then the donor substrate 100 may be removed from the substrate 50. In this case, inert gases such as a nitrogen gas and/or an argon gas from the nozzles may be sprayed between the substrate 50 and the donor substrate 100 to facilitate the separation of the donor substrate 100.

In FIGS. 5 to 7, the laser induced thermal imaging process may be performed using the donor substrate 100 described with reference to FIG. 1, however, the present embodiments may not be limited thereto. For example, the laser induced thermal imaging process may be performed using the donor substrates 200, 300, and 400 described with reference to FIGS. 2 to 4.

FIGS. 8 to 11 are cross sectional views illustrating a method of manufacturing an organic light emitting display device in accordance with example embodiments.

Figure 8:
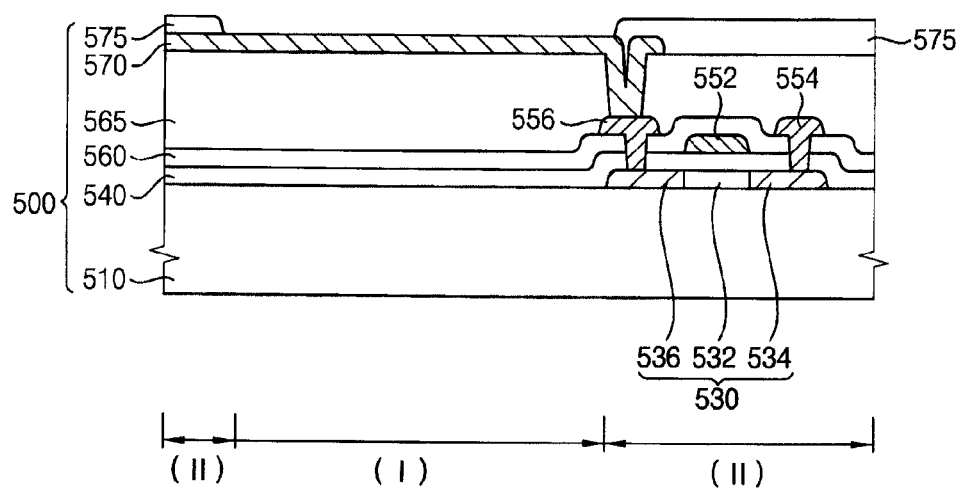

Referring to FIG. 8, a display panel 500 having a first electrode 570 and a pixel defining layer 575 may be provided.

When the organic light emitting display device has an active matrix type, the switching structure may be disposed between the first substrate 510 and the first electrode 570. In example embodiments, the switching structure may include a switching device, at least one insulation layer, a contact, a pad, etc.

When the switching device in the switching structure includes the thin film transistor, the switching device may include a semiconductor layer 530, a gate electrode 552, a source electrode 554, a drain electrode 556, etc.

In example embodiments, the semiconductor layer 530 may be formed on the first substrate 510, and the semiconductor layer 530 may be divided into a source region 534, a drain region 536 and a channel region 532 through an ion implantation process. Then, a gate insulation layer 540 may be formed to electrically isolate the semiconductor layer 530.

A gate electrode 552 may be formed on the gate insulation layer 540, and then a first insulation layer 560 may be formed on the gate insulation layer 540 and the gate electrode 552.

The source electrode 554 and the drain electrode 556 may be formed through the gate insulation layer 540 and the first insulation layer 560 to contact the source and the drain regions 534 and 536, respectively. Then, a second insulation layer 560 may be formed to electrically isolate the source electrode 554 and the drain electrode 556.

In the FIG. 8, the switching device including the thin film transistor may have a top gate configuration in which the gate electrode 552 may be disposed over the semiconductor layer 530, however, the configuration of the switching device may not be limited thereto. For example, the switching device may have a bottom gate configuration in which a gate electrode may be disposed under the semiconductor layer.

The first electrode 570 may be formed on the switching structure in a pixel region I, and a pixel defining layer 575 may be formed in a peripheral region II on the switching structure where the first electrode 570 is not positioned.

In example embodiments, the first electrode 570 may serve as an anode for providing holes into the hole transfer layer 590 of the light emitting structure, and depending on an emission type of the organic light emitting display device, the first electrode 570 may be a transparent electrode or a semi-transparent electrode. For example, the first electrode 570 may include a transparent conductive material such as indium tin oxide (ITO), zinc tin oxide (ZTO), indium zinc oxide (IZO), zinc oxide (ZnOx), tin oxide (SnOx), gallium oxide (GaOx), etc.

Figure 9:
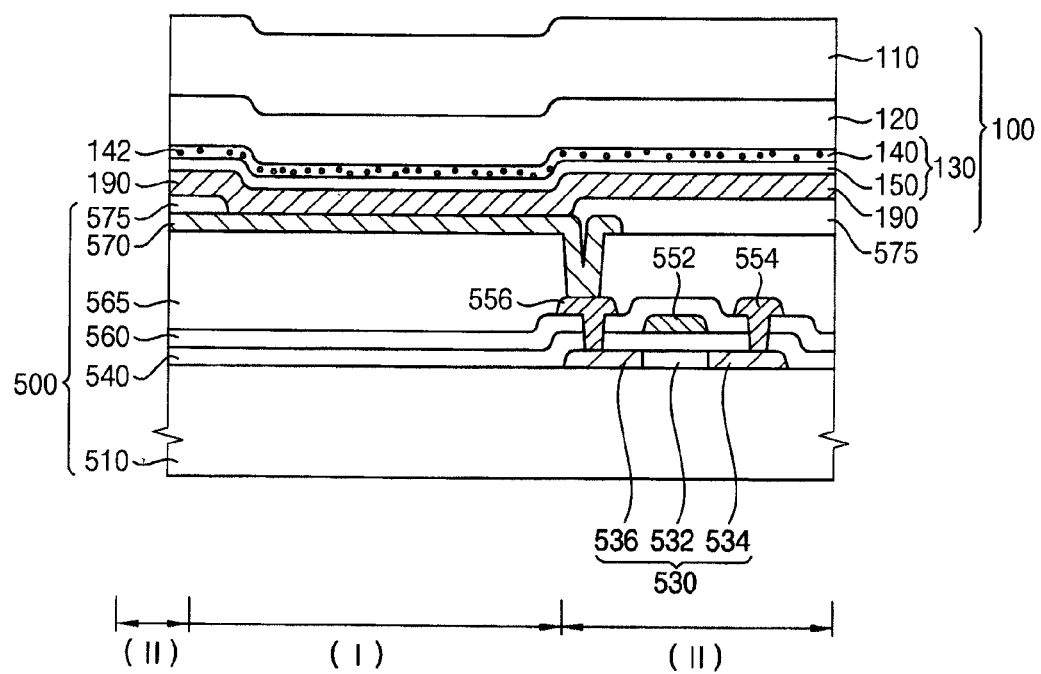

Referring to FIG. 9, the donor substrate 100 may be laminated on the display panel 500. The donor substrate 100 may have a construction substantially the same as or substantially similar to that of the donor substrate 100 described with reference to FIG. 1. Thus, detailed description thereof may be omitted.

In example embodiments, after mounting the display panel 500 on a supporting apparatus (not illustrated), the display panel 500 may be aligned with the donor substrate 100. Then, a pressurizing member (not illustrated) may pressurize the donor substrate 100 to laminate the donor substrate 100 on the display panel 500.

The display panel 500 may have an uneven upper face. For example, the pixel defining layer 575 in the pixel region I may have an upper face higher than that of the first electrode 570 in peripheral region II. Therefore, a step portion may be formed between the pixel region I and the peripheral region II.

The donor substrate 100 may be laminate according to the profile of the display panel 500. For example, the donor substrate 100 may be bent at the step portion of the display panel. The donor substrate 100 may include a porous layer 140 having a plurality of pores 142, so that the donor substrate 100 having an improved flexibility may be easily adhered on the display panel 500.

Figure 10:
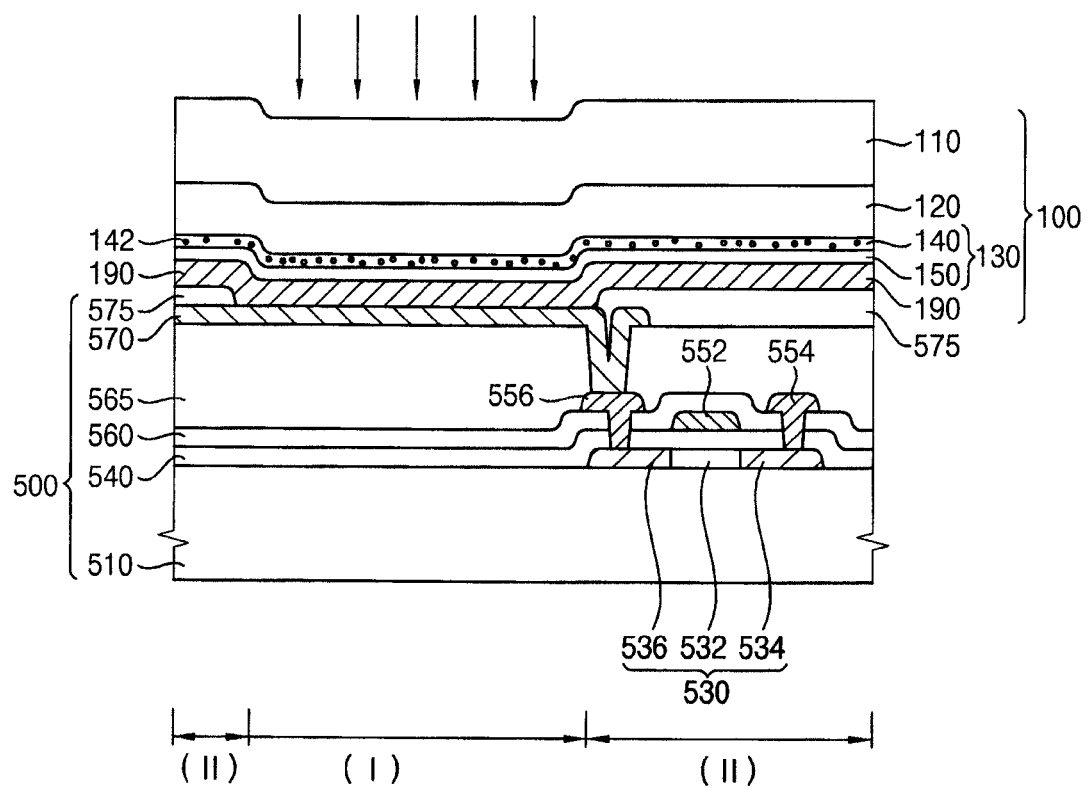

Referring to FIG. 10, a laser beam may be irradiated on the donor substrate 100. In example embodiments, the laser beam may be irradiated on a portion of the donor substrate 100 in the pixel region I. The processes of irradiating the laser beam may be substantially the same as or substantially similar to the processes described with reference to FIG. 6.

In example embodiments, the organic layer pattern 590 (see FIG. 11) may be formed from the transfer layer 190 at a pressure below about $10^{-2}$ Torr. The organic layer pattern 590 may be formed in a vacuum chamber, so that pollutions of the display panel 500 and the organic layer pattern 590 may be prevented in a formation of the organic layer pattern 590. As a result, a life time of the organic light emitting display device including the organic layer pattern 590 may be enlarged.

In some example embodiments, the transfer layer 190 may be formed in an atmosphere containing an inert gas. For example, the atmosphere containing the inert gas may include the inert gas and water vapor, or the inert gas and an oxygen gas ($O_2$). For example, the inert gas may include a nitrogen ($N_2$) gas and/or an argon (Ar) gas, and a concentration of water vapor in the atmosphere containing the inert gas may be below about 10 ppm. Alternatively, a concentration of oxygen gas ($O_2$) in the atmosphere containing the inert gas may be below about 50 ppm. An oxygen gas and water vapor from outside may be easily mixed with the atmosphere containing the inert gas, so that a pollution of the organic layer pattern 590 may be prevented by controlling concentrations of water vapor and oxygen gas.

Figure 11:
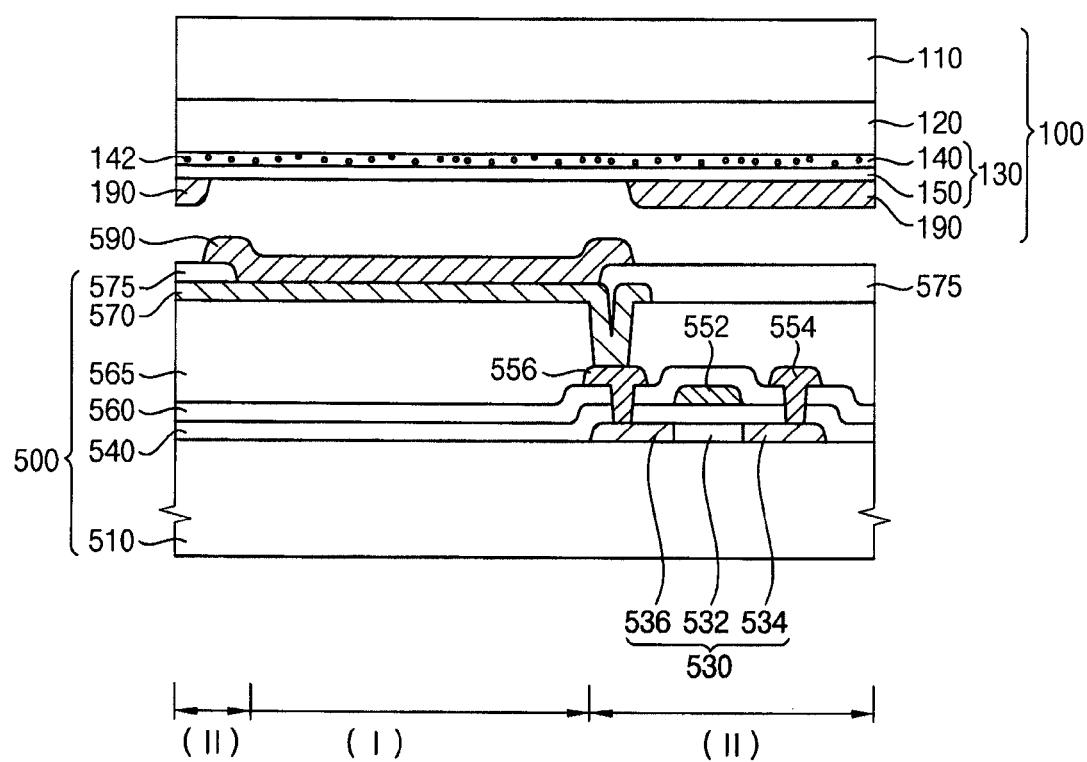

Referring to FIG. 11, the donor substrate 100 may be removed from the display panel 500.

As described above, the organic layer pattern 590 may be formed on the display panel 500 from the transfer layer 190 of the donor substrate 100, and then the donor substrate 100 may be removed from the display panel 500. In this case, the gases including inert gas such as nitrogen gas, argon gas, etc. from the nozzles may be sprayed between the display panel 500 and the donor substrate 100 to facilitate the separation of the donor substrate 100.

In FIGS. 8 to 11, the laser induced thermal imaging process may be performed using the donor substrate 100 described with reference to FIG. 1, however, the present embodiments may not be limited thereto. For example, the laser induced thermal imaging process may be performed using the donor substrates 200, 300, and 400 described with reference to FIGS. 2 to 4.

In example embodiments, the organic layer pattern 590 may correspond to an organic light emitting layer, however, the present embodiments may not be limited thereto. For example, the organic layer pattern 590 may correspond to a hole injection layer, a hole transfer layer, an electron injection layer, an electron transfer layer or a color filter layer.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present embodiments. Accordingly, all such modifications are intended to be included within the scope of the present embodiments as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A donor substrate comprising:
   a base substrate;
   a light to heat conversion layer disposed on the base substrate;
   a buffer layer disposed on the light to heat conversion layer, the buffer layer including at least one porous layer having a plurality of pores; and
   a transfer layer disposed on the buffer layer.

2. The donor substrate of claim 1, wherein the buffer layer further includes at least one intermediate layer disposed on or under the porous layer.

3. The donor substrate of claim 2, wherein the buffer layer includes two porous layers and the intermediate layer is disposed between the porous layers.

4. The donor substrate of claim 2, wherein the intermediate layer is disposed between the porous layer and the transfer layer.

5. The donor substrate of claim 2, wherein the buffer layer further includes at least one heat dissipation layer disposed on or under the intermediate layer.

6. The donor substrate of claim 5, wherein the heat dissipation layer includes at least one selected from the group consisting of aluminum (Al), silver (Ag), chromium (Cr), tin (Sn), nickel (Ni), titanium (Ti), cobalt (Co), zinc (Zn), gold (Au), copper (Cu), tungsten (W), molybdenum (Mo) and lead (Pb).

7. The donor substrate of claim 1, wherein the porous layer includes at least one selected from the group consisting of polyimide, polyester, polycarbonate, polyacryl, polyepoxy, polyethylene, polystyrene and polyethylene terephthalate.

8. The donor substrate of claim 1, wherein the buffer layer blocks heat transfer from the light to heat conversion layer into the transfer layer.

9. A laser induced thermal imaging method comprising:
   providing a donor substrate including a base substrate, a light to heat conversion layer, a transfer layer and a buffer layer having at least one porous layer;
   laminating the donor substrate on a substrate;
   irradiating a laser beam onto the donor substrate to form an organic layer pattern on the substrate from the transfer layer; and
   removing the donor substrate from the substrate.

10. The method of claim 9, wherein the buffer layer includes at least two porous layers and at least one intermediate layer disposed between the porous layers.

11. The method of claim 9, wherein the buffer layer further includes at least one heat dissipation layer disposed on or under the intermediate layer.

12. The method of claim 11, wherein the heat dissipation layer includes at least one selected from the group consisting of aluminum (Al), silver (Ag), chromium (Cr), tin (Sn), nickel (Ni), titanium (Ti), cobalt (Co), zinc (Zn), gold (Au), copper (Cu), tungsten (W), molybdenum (Mo) and lead (Pb).

13. A method of manufacturing an organic light emitting display device, the method comprising:
   providing a display panel including a switching structure and a first electrode;
   providing a donor substrate including a base substrate, a light to heat conversion layer, a transfer layer and a buffer layer having at least one porous layer;

laminating the donor substrate on the display panel;
irradiating a laser beam onto the donor substrate to form an organic layer pattern on the display panel from the transfer layer; and
removing the donor substrate from the display panel.

14. The method of claim 13, wherein the buffer layer includes at least two porous layers and at least one intermediate layer disposed between the porous layers.

15. The method of claim 13, wherein the organic layer pattern includes at least one selected from the group consisting of an organic light emitting layer, a hole injection layer, a hole transfer layer, an electron injection layer and an electron transfer layer.

16. The method of claim 13, wherein the buffer layer blocks heat transfer from the light to heat conversion layer into the transfer layer during irradiating the laser beam onto the donor substrate.

17. The method of claim 13, wherein the buffer layer further includes at least one heat dissipation layer disposed on or under the intermediate layer.

18. The method of claim 17, wherein the heat dissipation layer includes at least one selected from the group consisting of aluminum (Al), silver (Ag), chromium (Cr), tin (Sn), nickel (Ni), titanium (Ti), cobalt (Co), zinc (Zn), gold (Au), copper (Cu), tungsten (W), molybdenum (Mo) and lead (Pb).

* * * * *